US012563867B2

(12) United States Patent
Bang et al.

(10) Patent No.: US 12,563,867 B2
(45) Date of Patent: Feb. 24, 2026

(54) SEMICONDUCTOR LIGHT EMITTING ELEMENT, DISPLAY DEVICE, AND METHOD FOR MANUFACTURING DISPLAY DEVICE

(71) Applicant: LG ELECTRONICS INC., Seoul (KR)

(72) Inventors: Kyuhyun Bang, Seoul (KR); Hwanjoon Choi, Seoul (KR); Taehoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 365 days.

(21) Appl. No.: 18/032,700

(22) PCT Filed: Oct. 22, 2020

(86) PCT No.: PCT/KR2020/014534
§ 371 (c)(1),
(2) Date: Apr. 19, 2023

(87) PCT Pub. No.: WO2022/085826
PCT Pub. Date: Apr. 28, 2022

(65) Prior Publication Data
US 2023/0395748 A1     Dec. 7, 2023

(51) Int. Cl.
*H10H 20/819* (2025.01)
*H01L 25/075* (2006.01)
(Continued)

(52) U.S. Cl.
CPC ....... *H10H 20/819* (2025.01); *H01L 25/0753* (2013.01); *H10H 20/831* (2025.01); *H10H 20/032* (2025.01)

(58) Field of Classification Search
CPC .. H10H 20/819; H10H 20/831; H10H 20/032; H10H 20/84; H10H 20/0364; H10H 20/857; H10H 20/872; H01L 25/0753
See application file for complete search history.

(56) References Cited

U.S. PATENT DOCUMENTS

| | | | |
|---|---|---|---|
| 7,935,974 B2 * | 5/2011 | Kim | H01L 25/0756 257/88 |
| 2009/0261318 A1 * | 10/2009 | Cheong | H10H 20/82 257/E33.023 |

(Continued)

FOREIGN PATENT DOCUMENTS

| | | |
|---|---|---|
| JP | 2014-13938 A | 1/2014 |
| KR | 10-2007-0088176 A | 8/2007 |

(Continued)

*Primary Examiner* — Karen Kusumakar
(74) *Attorney, Agent, or Firm* — Birch, Stewart, Kolasch & Birch, LLP

(57) ABSTRACT

Disclosed are a semiconductor light emitting element, a display device, and a method for manufacturing a display device. A semiconductor light emitting element according to an embodiment of the present disclosure comprises: a first conductive semiconductor layer and a second conductive semiconductor layer; an active layer located between the first conductive semiconductor layer and the second conductive semiconductor layer; a semiconductor structure protruding from one surface of at least one of the first conductive semiconductor layer or the second conductive semiconductor layer; and a metal layer laminated on the outer surface of the semiconductor structure.

19 Claims, 18 Drawing Sheets

1000

(51) Int. Cl.
  *H10H 20/831*     (2025.01)
  *H10H 20/01*     (2025.01)

(56)         References Cited

U.S. PATENT DOCUMENTS

2010/0012920 A1* 1/2010 Park ..................... H10H 20/825
                                                       257/E33.026
2012/0286286 A1* 11/2012 Jung ..................... H10H 20/81
                                                       257/E33.028

FOREIGN PATENT DOCUMENTS

KR      10-2008-0041817 A      5/2008
KR            10-1499952 B1      3/2015
KR            10-1673259 B1     11/2016

* cited by examiner

| R(um) | h(um) |
|---|---|
| 2 | 1.73 |
| 3 | 2.60 |
| 4 | 3.46 |
| 5 | 4.33 |
| 6 | 5.20 |
| 7 | 6.06 |
| 8 | 6.93 |

1600

Pattern dielectric layer including at least one opening on one surface of semiconductor layer — S1620

Form semiconductor structure via selective growth from opening along first crystal surface — S1640

Stack metal layer on outer surface of semiconductor structure — S1660

Bring metal layer into contact with wiring electrode of wiring substrate — S1680

SEMICONDUCTOR LIGHT EMITTING ELEMENT, DISPLAY DEVICE, AND METHOD FOR MANUFACTURING DISPLAY DEVICE

CROSS REFERENCE TO RELATED APPLICATIONS

This application is the National Phase of PCT/KR2020/014534 filed on Oct. 22, 2020, which is hereby expressly incorporated by reference into the present application.

TECHNICAL FIELD

The present disclosure relates to a semiconductor light emitting device, a display device, and a method of manufacturing the display device.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

On the other hand, LED (light emitting diode), which is a well-known semiconductor light-emitting device that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting device may be proposed.

The semiconductor light emitting devices may be transferred onto a substrate and electrically connected to a wiring electrode in various ways. In this case, a bonding process is required to ensure stable electrical connection between the device electrode of the semiconductor light emitting device and the wiring electrode on the wiring substrate, which may cause problems such as complexity and cost increase in the factory.

DISCLOSURE

Technical Problem

An object of embodiment(s) is to provide a semiconductor light emitting device, a display device, and a method of manufacturing the display device for a simple electrical connection process of a semiconductor light emitting device and a wiring electrode and stable electrical connection therebetween.

Technical Solution

According to an aspect, a semiconductor light emitting device may include a first conductive semiconductor layer and a second conductive semiconductor layer; an active layer disposed between the first conductive semiconductor layer and the second conductive semiconductor layer; a semiconductor structure protruding from one surface of at least one semiconductor layer of the first conductive semiconductor layer or the second conductive semiconductor layer; and a metal layer stacked and disposed on an outer surface of the semiconductor structure.

The semiconductor light emitting device may further include a dielectric layer disposed on one surface of the first conductive semiconductor layer or one surface of the second conductive semiconductor layer except for an area in contact with the semiconductor structure and a peripheral area of the semiconductor structure.

The semiconductor structure may be provided in plurality for the first conductive semiconductor layer or the second conductive semiconductor layer.

The semiconductor structure may be formed in one of shapes of a cone, a polygonal pyramid, a cylinder, a prism, a truncated cone, and a truncated pyramid.

The semiconductor structure may be connected to a semiconductor crystal on one surface of a semiconductor layer positioned among the first conductive semiconductor layer and the second conductive semiconductor layer.

The semiconductor structure may be formed with a height of 25% to 45% of a thickness obtained by excluding the semiconductor structure from the semiconductor light emitting device, and the semiconductor structure is formed with a diameter corresponding to the height of the semiconductor structure.

The ohmic contact may be formed between a peripheral area of the semiconductor structure and the metal layer.

The second conductive semiconductor layer may be formed with a step difference with the first conductive semiconductor layer in a first direction; and a height of the semiconductor structure for the second conductive semiconductor layer and a height of the semiconductor structure for the first conductive semiconductor layer may be different by the step difference.

According to another aspect, a display device may include a wiring substrate having one surface on which a wiring electrode is disposed; an adhesive layer disposed to surround the wiring electrode; and a semiconductor light emitting device including a first conductive semiconductor layer, a second conductive semiconductor layer, an active layer disposed between the first conductive semiconductor layer and the second conductive semiconductor layer, and an device electrode that comes into contact with the wiring electrode by pressing and penetrating the adhesive layer, wherein the device electrode includes: at least one semiconductor structure protruding and formed by a first height from one surface of at least one semiconductor layer of the first conductive semiconductor layer and the second conductive semiconductor layer; and a metal layer stacked and disposed on an outer surface of the semiconductor structure.

The semiconductor light emitting device may further include a dielectric layer formed on one surface of a semiconductor layer, on which the semiconductor structure is formed, among the first conductive semiconductor layer and the second conductive semiconductor layer except for an area in contact with the semiconductor structure and a peripheral area of the semiconductor structure.

The semiconductor light emitting device may further include ohmic contact between the peripheral area of the semiconductor structure and the metal layer.

The semiconductor structure may be formed in a shape in which a cross-sectional area decreases from one surface of the dielectric layer to an arbitrary section of the first height.

The semiconductor structure may be formed for both the first conductive semiconductor layer and the second conductive semiconductor layer; the first conductive semiconductor layer and the second conductive semiconductor layer may be formed with a step difference in a first direction; and the first height of the semiconductor structure formed for the first conductive semiconductor layer and the first height of the semiconductor structure formed for the second conductive semiconductor layer may be different.

The wiring electrode may be formed of a metal having a lower hardness or higher ductility than the semiconductor structure.

A groove corresponding to a shape of the device electrode may be formed on one surface of the wiring electrode, which is in contact with the device electrode.

The adhesive layer may include an adhesive material and a diluent lowering viscosity of the adhesive material.

According to still another aspect, a method of manufacturing a display device may include patterning a dielectric layer including at least one opening on one surface of a semiconductor layer doped with an arbitrary conductivity type; forming a semiconductor structure through selective growth from the opening along a first crystal surface; stacking a metal layer on an outer surface of the semiconductor structure; and bringing the metal layer into contact with a wiring electrode of a wiring substrate.

The patterning of the dielectric layer may include performing the patterning the dielectric layer for a first conductive semiconductor layer doped with a first conductivity type and a second conductive semiconductor layer doped with a second conductivity type and having a step difference with the first conductive semiconductor layer in a first direction; and the forming of the semiconductor structure may include forming a semiconductor structure formed for the first conductive semiconductor layer and a semiconductor structure formed for the second conductive semiconductor layer with different sizes.

The brining the metal layer into contact with the wiring electrode may include forming an adhesive layer molding the wiring electrode on the wiring substrate; electrically connecting the metal layer and the wiring electrode without forming a conductive medium through transfer of the semiconductor light emitting device to the wiring substrate; and deforming one end of the metal layer in contact with the wiring electrode or a region of the wiring electrode in contact with the metal layer.

The electrically connecting the metal layer and the wiring electrode may be performed in a state in which heat is applied; and the deforming one end of the metal layer in contact with the wiring electrode or the region of the wiring electrode in contact with the metal layer may include curing.

Advantageous Effects

According to a semiconductor light emitting device, a display device, and a method of manufacturing the display device according to the present disclosure, electrical connection between the semiconductor light emitting device and a wiring electrode may be easily and stably achieved through a structure of the semiconductor light emitting device without a separate bonding medium.

According to the semiconductor light emitting device, the display device, and the method of manufacturing the display device according to the present disclosure, total internal reflection of the semiconductor light emitting device may be suppressed through the structure of the semiconductor light emitting device to increase light extraction efficiency, thereby improving product performance.

According to the semiconductor light emitting device, the display device, and the method of manufacturing the display device according to the present disclosure, a process for electrical connection between the semiconductor light emitting device and the wiring electrode may be simplified only by adding a simple process step in the growth process of the semiconductor light emitting device.

According to the semiconductor light emitting device, the display device, and the manufacturing method of the display device according to the present disclosure, transfer of the semiconductor light emitting device and the electrical connection with the wiring electrode may be performed simultaneously, thereby simplifying the product production process.

According to the semiconductor light emitting device, the display device, and the manufacturing method of the display device according to the present disclosure, it may be possible to reduce production cost while improving product yield through process simplification.

DESCRIPTION OF DRAWINGS

FIG. 2 is a partially enlarged diagram showing a part A shown in FIG. 1, and FIGS. 3A and 3B are cross-sectional diagrams taken along the cutting lines B-B and C-C in FIG. 2.

FIGS. 5A to 5C are conceptual diagrams illustrating various examples of color implementation with respect to a flip-chip type semiconductor light emitting device.

FIG. 8 is a cross-sectional diagram taken along a cutting line D-D shown in FIG. 7.

FIG. 10 is a diagram showing a semiconductor light emitting device according to an embodiment of the present disclosure.

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

In addition, when an element such as a layer, region or module is described as being "on" another element, it is to be understood that the element may be directly on the other element or there may be an intermediate element between them.

The display device described herein is a concept including a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like. However, it will be readily apparent to those skilled in the art that the configuration according to the embodiments described herein is applicable even to a new product that will be developed later as a display device.

Figure 1:
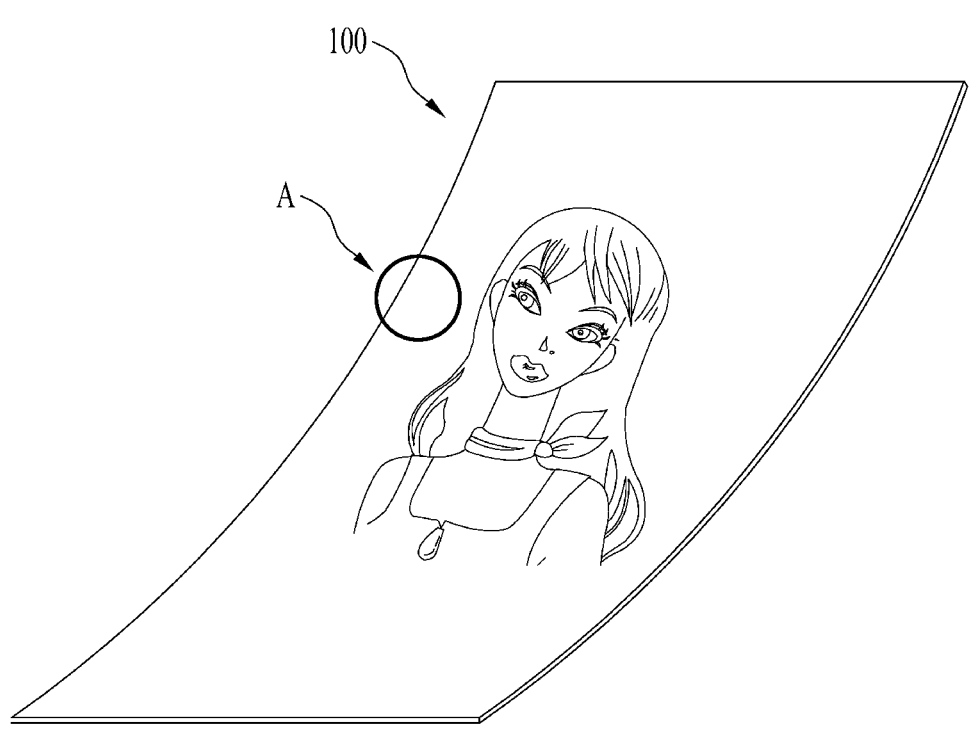
FIG. 1 is a conceptual diagram illustrating an embodiment of a display device using a semiconductor light emitting device according to the present disclosure.

FIG. 1 is a conceptual view illustrating an embodiment of a display device using a semiconductor light emitting device according to the present disclosure.

According to the drawings, information processed by a controller (not shown) of a display device 100 may be displayed using a flexible display.

The flexible display may include, for example, a display that may be warped, bent, twisted, folded, or rolled by external force. For example, the flexible display may be, for example, a display manufactured on a thin and flexible substrate that may be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting device. In the present disclosure, a light emitting diode (LED) is exemplified as a type of the semiconductor light emitting device configured to convert electric current into light. The LED may be formed in a small size, and may thus serve as a unit pixel even in the second state.

Hereinafter, a flexible display implemented using the LED will be described in more detail with reference to the drawings.

Figure 2:
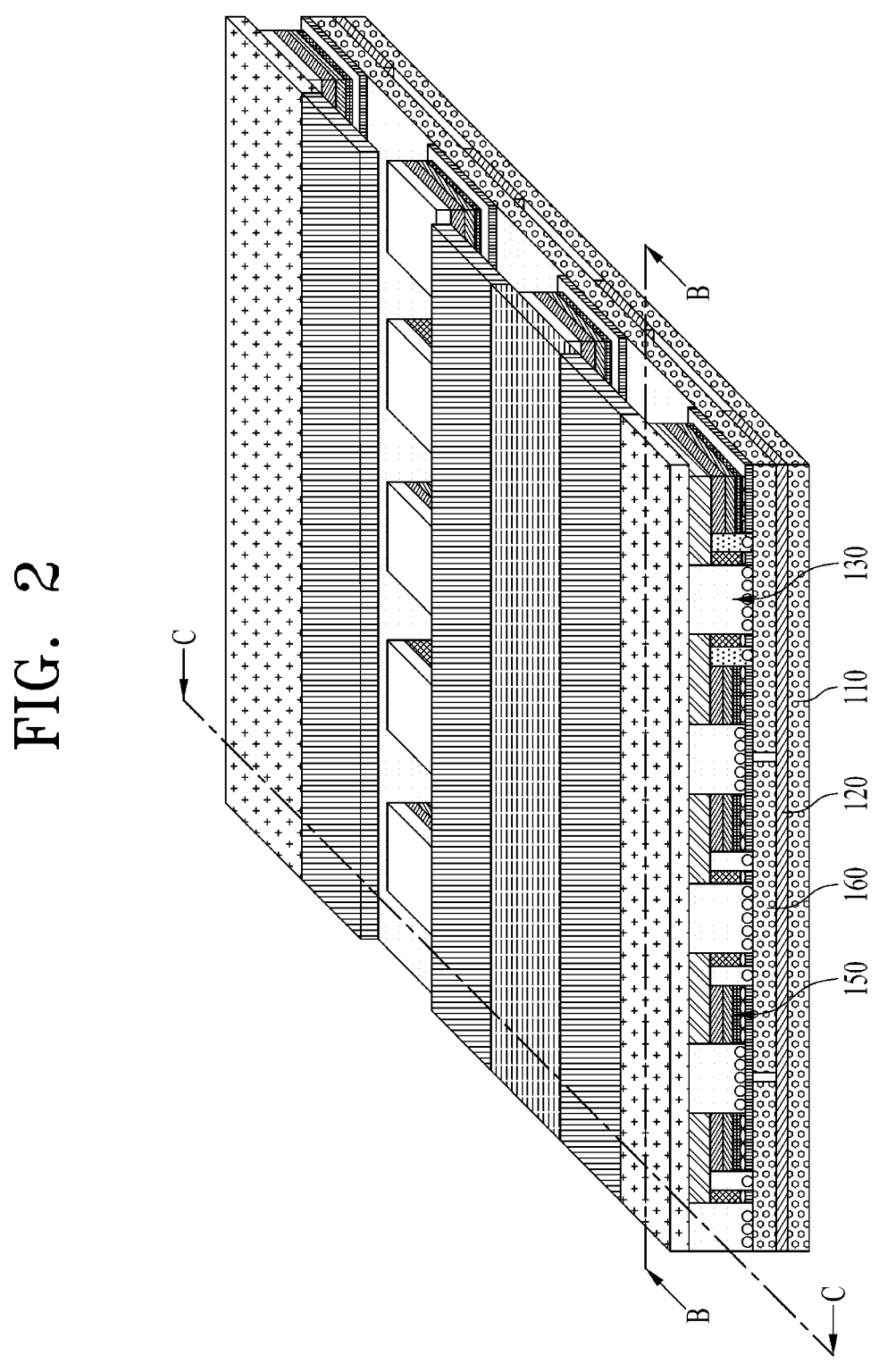
Figures 3A, 3B:
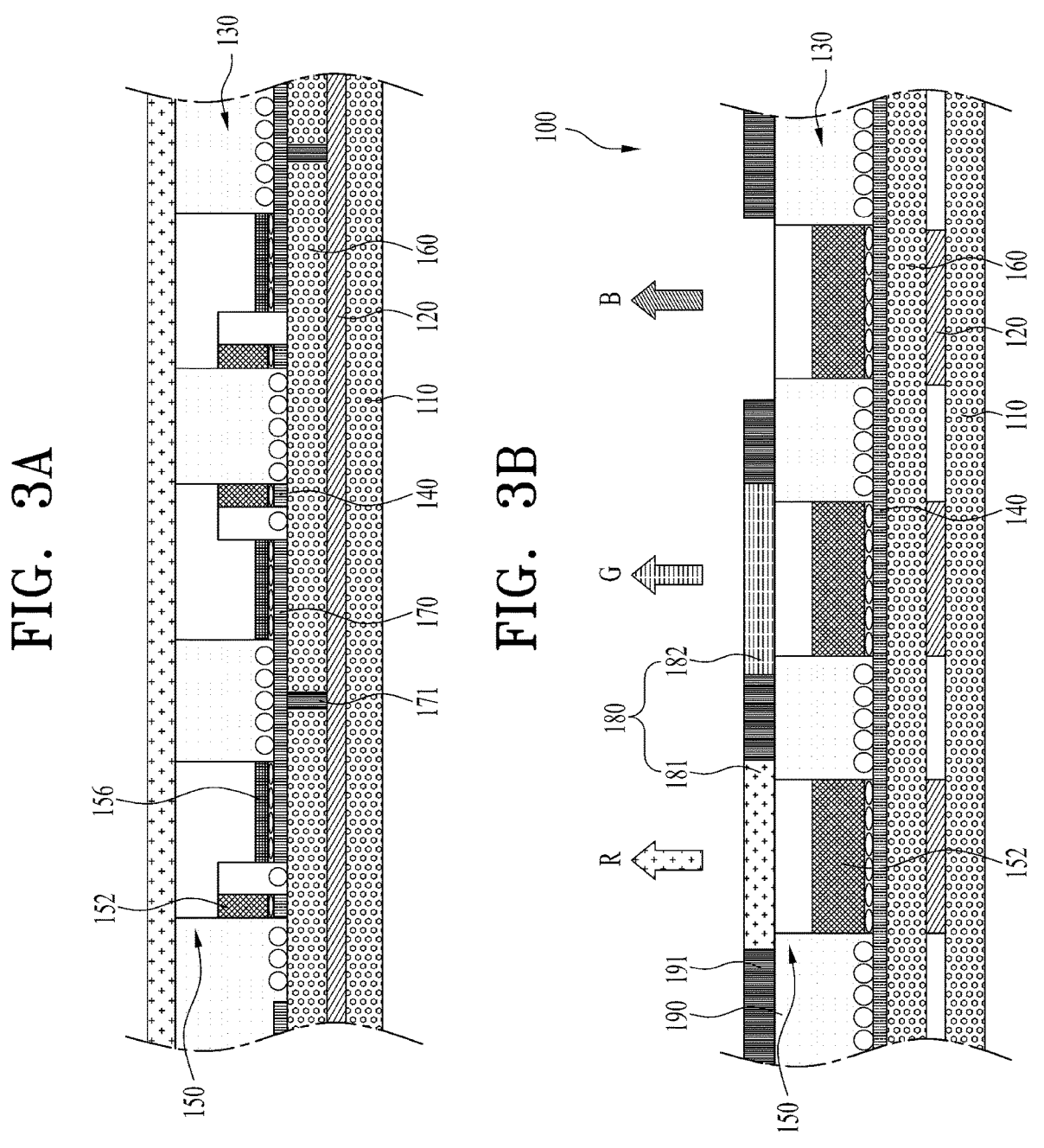
Figure 4:
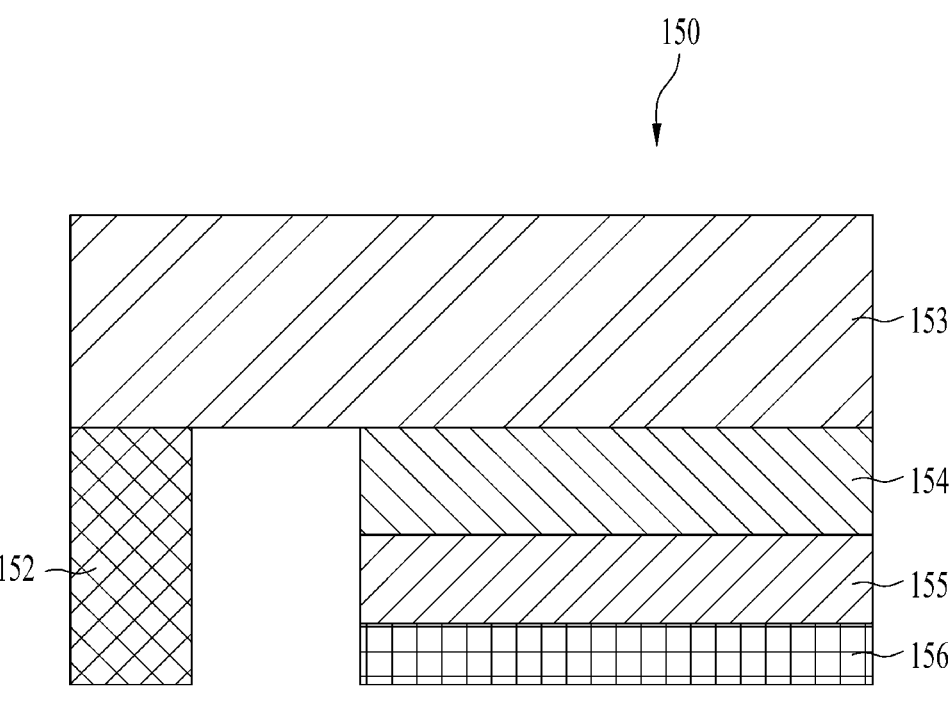
FIG. 4 is a conceptual diagram illustrating the flip-chip type semiconductor light emitting device of FIG. 3.

FIG. 2 is a partially enlarged view showing part A of FIG. 1, FIGS. 3A and 3B are cross-sectional views taken along lines B-B and C-C in FIG. 2, FIG. 4 is a conceptual view illustrating the flip-chip type semiconductor light emitting device of FIG. 3, and FIGS. 5A to 5C are conceptual views illustrating various examples of implementation of colors in relation to a flip-chip type semiconductor light emitting device.

As shown in FIGS. 2, 3A and 3B, the display device 100 using a passive matrix (PM) type semiconductor light emitting device is exemplified as the display device 100 using a semiconductor light emitting device. However, the examples described below are also applicable to an active matrix (AM) type semiconductor light emitting device.

The display device 100 may include a substrate 110, a first electrode 120, a conductive adhesive layer 130, a second electrode 140, and at least one semiconductor light emitting device 150.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

According to the drawings, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting device 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

According to the drawings, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction.

Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

According to the drawings, the ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to the drawings, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting device 150 is connected thereto in a flip-chip form by applying heat and pressure. Thereby, the semiconductor light emitting device 150 is electrically connected to the first electrode 120 and the second electrode 140.

Referring to FIG. 4, the semiconductor light emitting device may be a flip chip-type light emitting device.

For example, the semiconductor light emitting device may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting devices 150. For example, p-type electrodes of semiconductor light emitting devices on left and right sides of an auxiliary electrode may be electrically connected to one auxiliary electrode.

More specifically, the semiconductor light emitting device 150 may be press-fitted into the conductive adhesive layer 130 by heat and pressure. Thereby, only the portions of the semiconductor light emitting device 150 between the p-type electrode 156 and the auxiliary electrode 170 and between the n-type electrode 152 and the second electrode 140 may exhibit conductivity, and the other portions of the semiconductor light emitting device 150 do not exhibit conductivity as they are not press-fitted. In this way, the conductive adhesive layer 130 interconnects and electrically connects the semiconductor light emitting device 150 and the auxiliary electrode 170 and interconnects and electrically connects the semiconductor light emitting device 150 and the second electrode 140.

The plurality of semiconductor light emitting devices 150 may constitute a light emitting device array, and a phosphor conversion layer 180 may be formed on the light emitting device array.

The light emitting device array may include a plurality of semiconductor light emitting devices having different luminance values. Each semiconductor light emitting device 150 may constitute a unit pixel and may be electrically connected to the first electrode 120. For example, a plurality of first electrodes 120 may be provided, and the semiconductor light emitting devices may be arranged in, for example, several columns. The semiconductor light emitting devices in each column may be electrically connected to any one of the plurality of first electrodes.

In addition, since the semiconductor light emitting devices are connected in a flip-chip form, semiconductor light emitting devices grown on a transparent dielectric substrate may be used. The semiconductor light emitting devices may be, for example, nitride semiconductor light emitting devices. Since the semiconductor light emitting device 150 has excellent luminance, it may constitute an individual unit pixel even when it has a small size.

According to the drawings, a partition wall 190 may be formed between the semiconductor light emitting devices 150. In this case, the partition wall 190 may serve to separate individual unit pixels from each other, and may be integrated with the conductive adhesive layer 130. For example, by inserting the semiconductor light emitting device 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting device 150. For example, the semiconductor light emitting device 150 may be a blue semiconductor light emitting device that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting device at a position of a unit pixel of red color, and the green phosphor 182 capable of converting blue light into green (G) light may be laminated on the blue semiconductor light emitting device at a position of a unit pixel of green color. Only the blue semiconductor light emitting device may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting device 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Figures 5A, 5B:
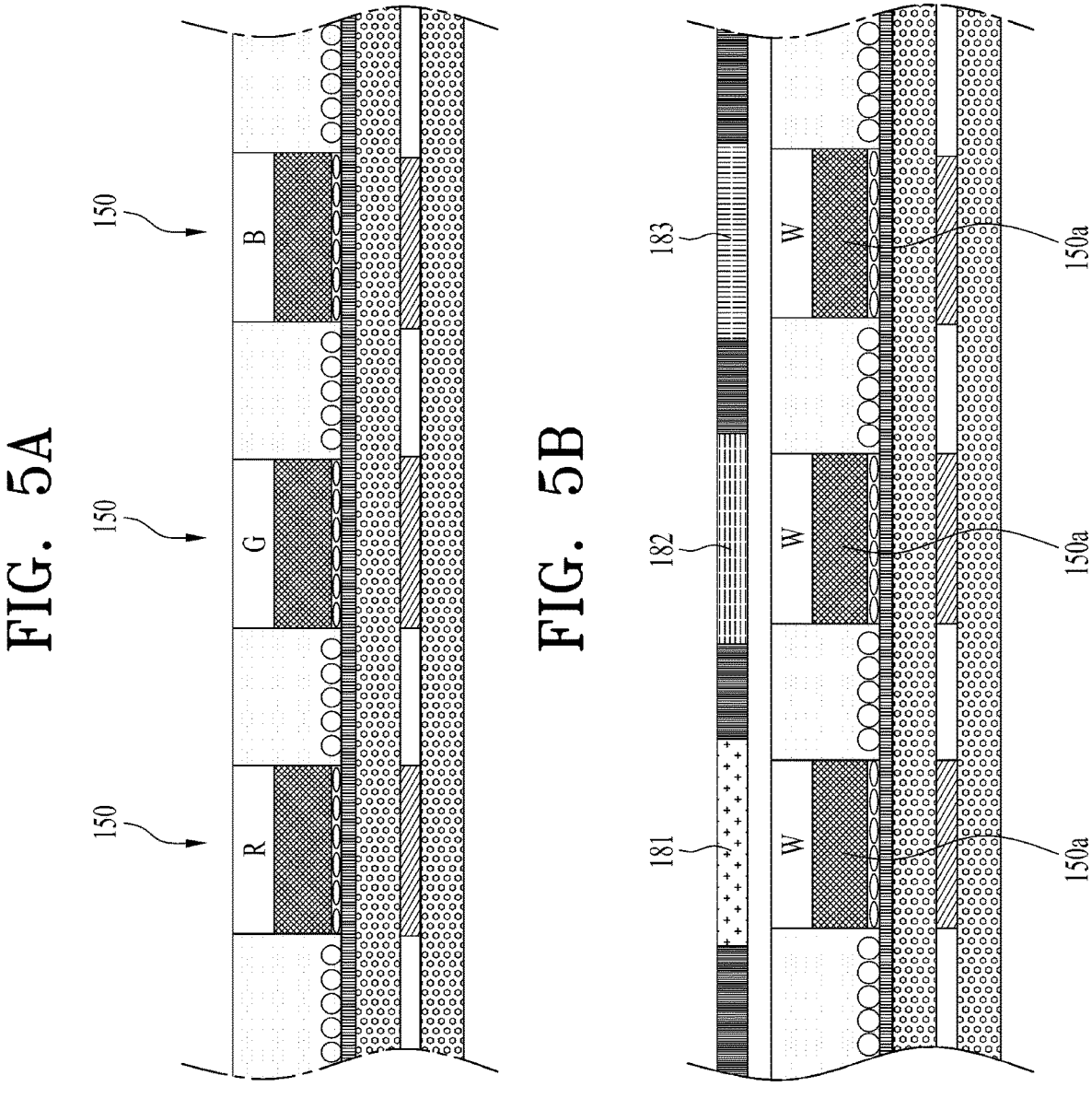

Referring to FIG. 5A, each semiconductor light emitting device may be implemented as a high-power light emitting device emitting light of various colors including blue by using gallium nitride (GaN) as a main material and adding indium (In) and/or aluminum (Al).

In this case, each semiconductor light emitting device may be a red, green, or blue semiconductor light emitting device to form a unit pixel (sub-pixel). For example, red, green, and blue semiconductor light emitting devices R, G, and B may be alternately disposed, and unit pixels of red, green, and blue may constitute one pixel by the red, green and blue semiconductor light emitting devices. Thereby, a full-color display may be implemented.

Referring to FIG. 5B, the semiconductor light emitting device 150*a* may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Figure 5C:
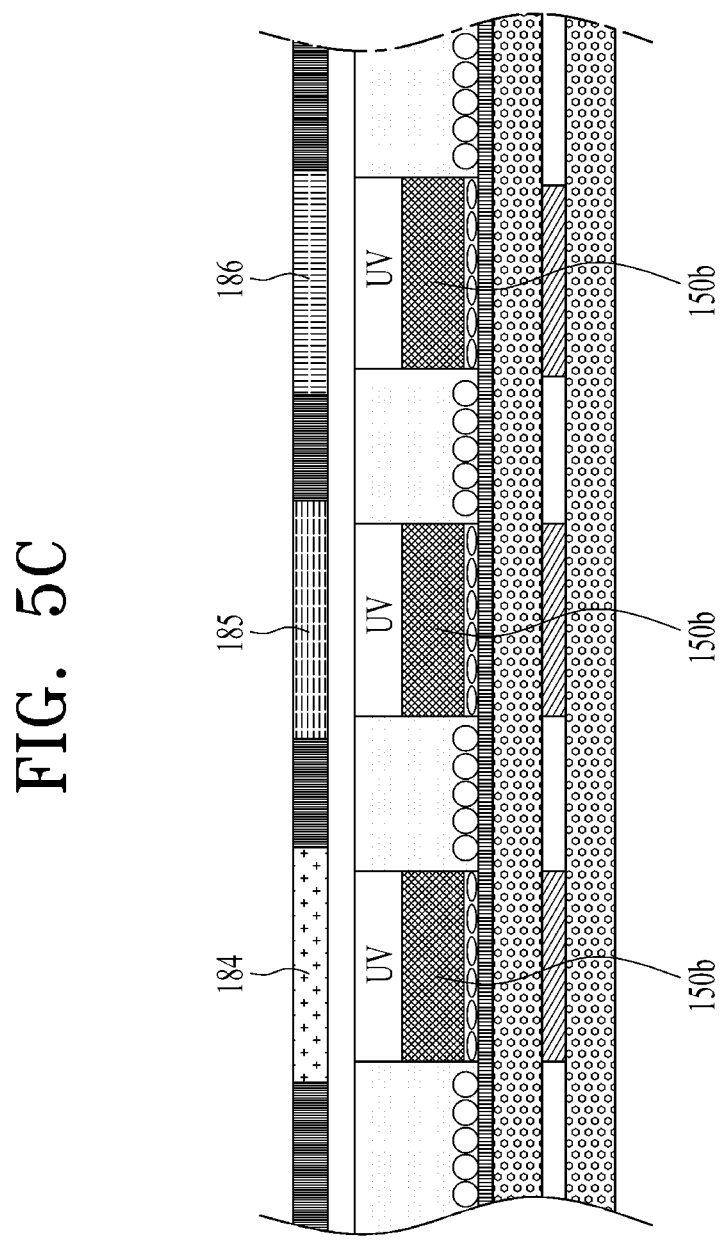

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting device. In an embodiment, UV may be used as an excitation source of the upper phosphor in the semiconductor light emitting device.

Referring back to this example, the semiconductor light emitting device is positioned on the conductive adhesive layer to constitute a unit pixel in the display device. Since the semiconductor light emitting device has excellent luminance, individual unit pixels may be configured despite even when the semiconductor light emitting device has a small size. Regarding the size of such an individual semiconductor light emitting device, the length of each side of the device may be, for example, 80 μm or less, and the device may have a rectangular or square shape. When the semiconductor light emitting device has a rectangular shape, the size thereof may be less than or equal to 20 μm×80 μm.

In addition, even when a square semiconductor light emitting device having a side length of 10 μm is used as a unit pixel, sufficient brightness to form a display device may be obtained. Therefore, for example, in case of a rectangular pixel having a unit pixel size of 600 μm×300 μm (i.e., one side by the other side), a distance of a semiconductor light emitting device becomes sufficiently long relatively. Thus, in this case, it is able to implement a flexible display device having high image quality over HD image quality.

The above-described display device using the semiconductor light emitting device may be prepared by a new fabricating method. Such a fabricating method will be described with reference to FIG. 6 as follows.

Figure 6:
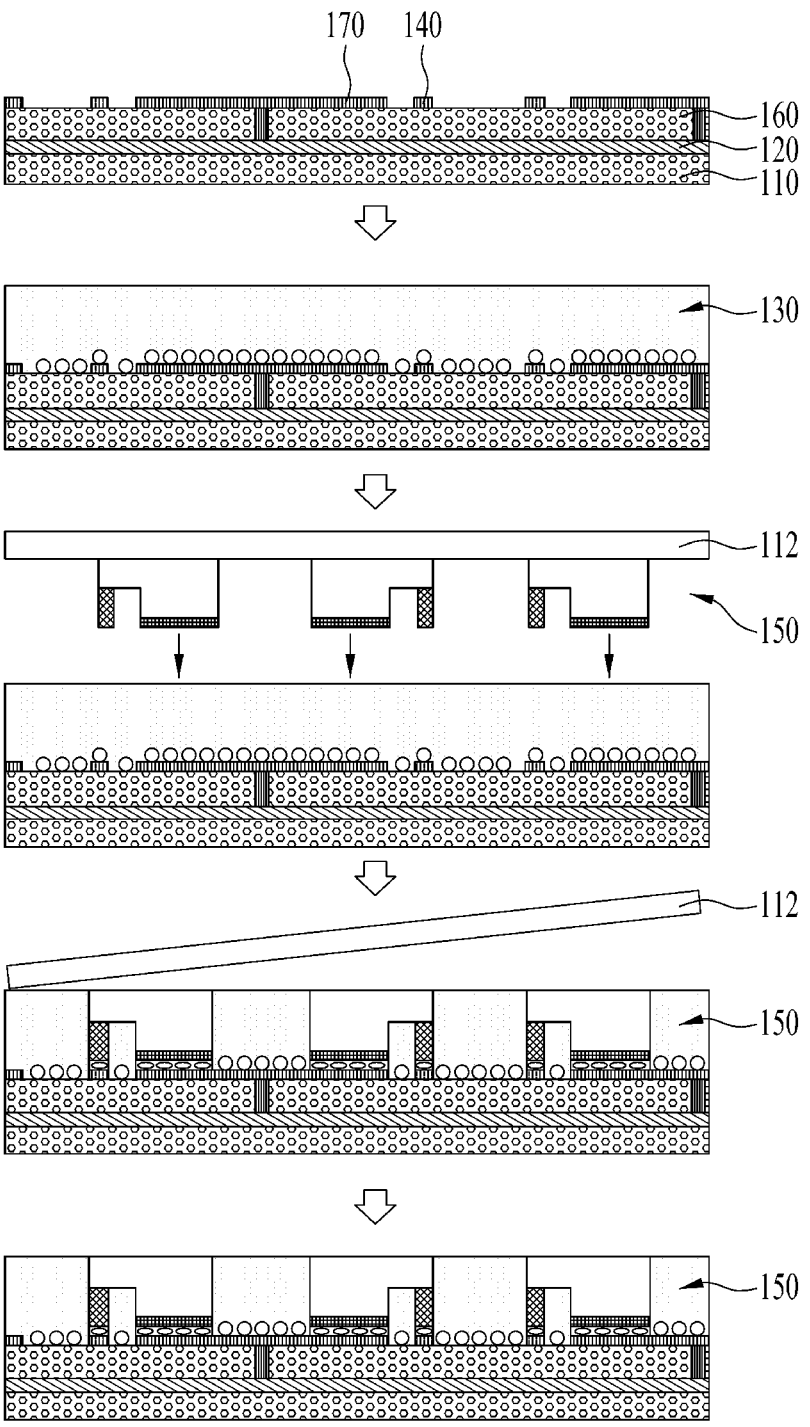
FIG. 6 shows cross-sectional views of a method of fabricating a display device using a semiconductor light emitting device according to the present disclosure.

FIG. 6 shows cross-sectional views of a method of fabricating a display device using a semiconductor light emitting device according to the present disclosure.

Referring to the drawing, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting devices 150 configuring individual pixels are located to correspond to locations of the auxiliary electrode 170 and the second electrodes 140, is disposed in a manner that the semiconductor light emitting device 150 confronts the auxiliary electrode 170 and the second electrode 140.

In this regard, the temporary 112 substrate 112 is a growing substrate for growing the semiconductor light emitting device 150 and may include a sapphire or silicon substrate.

The semiconductor light emitting device is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting device 150, the auxiliary electrode 170 and the second electrode 140 has conductivity, via which the electrodes and the semiconductor light emitting device 150 may be connected electrically. In this case, the semiconductor light emitting device 150 is inserted into the anisotropic conductive film, by which a partition may be formed between the semiconductor light emitting devices 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting devices 150 exposed externally. If necessary, the wiring substrate 110 to which the semiconductor light emitting devices 150 are coupled may be coated with silicon oxide (SiOx) or the like to form a transparent insulating layer (not shown).

In addition, a step of forming a phosphor layer on one side of the semiconductor light emitting device 150 may be further included. For example, the semiconductor light emitting device 150 may include a blue semiconductor light emitting device emitting Blue (B) light, and a red or green phosphor for converting the blue (B) light into a color of a unit pixel may form a layer on one side of the blue semiconductor light emitting device.

The above-described fabricating method or structure of the display device using the semiconductor light emitting device may be modified into various forms. For example, the above-described display device may employ a vertical semiconductor light emitting device.

Furthermore, a modification or embodiment described in the following may use the same or similar reference numbers for the same or similar configurations of the former example and the former description may apply thereto.

Figure 7:
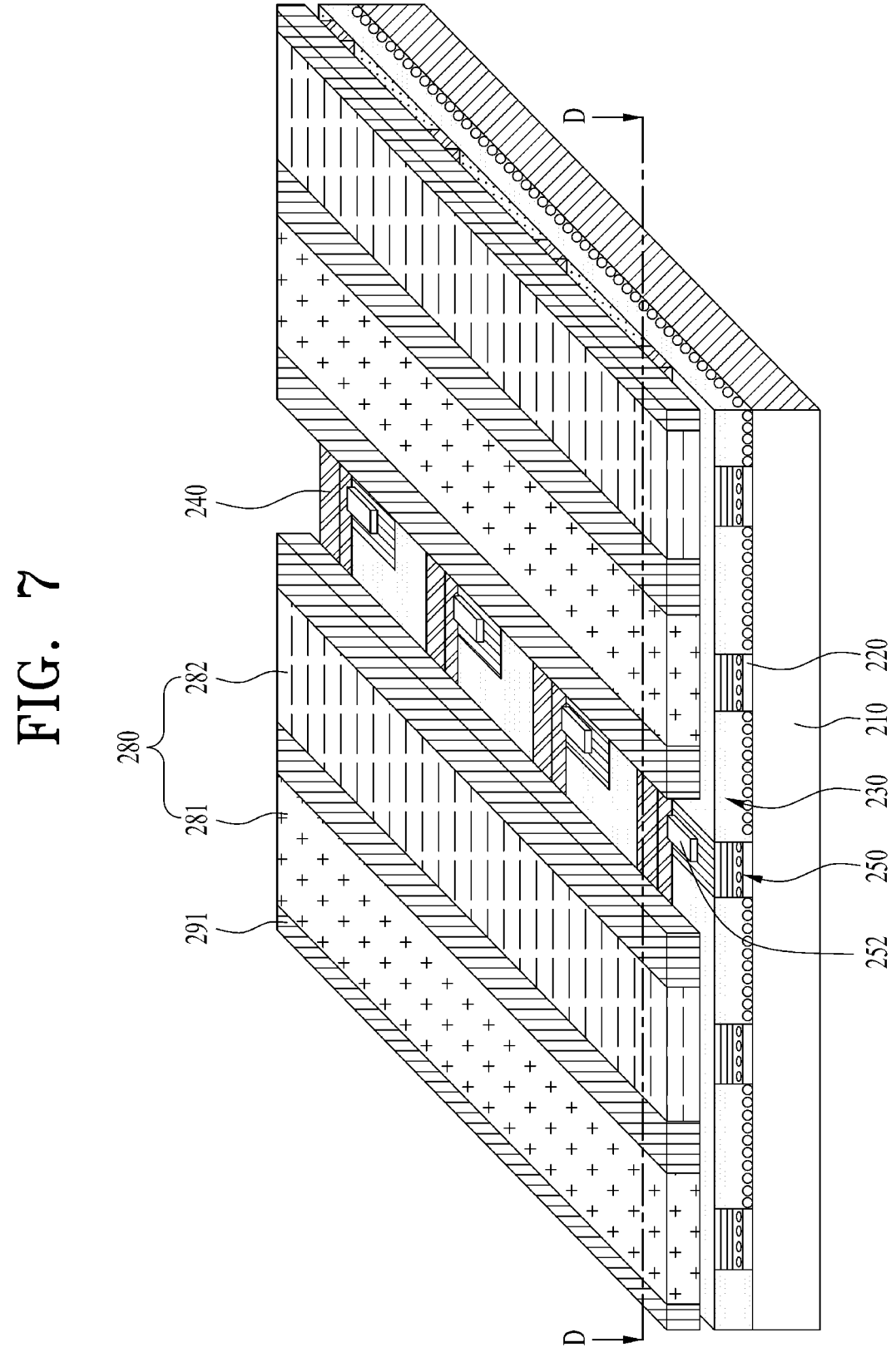
FIG. 7 is a perspective diagram of a display device using a semiconductor light emitting device according to another embodiment of the present disclosure.
Figure 8:
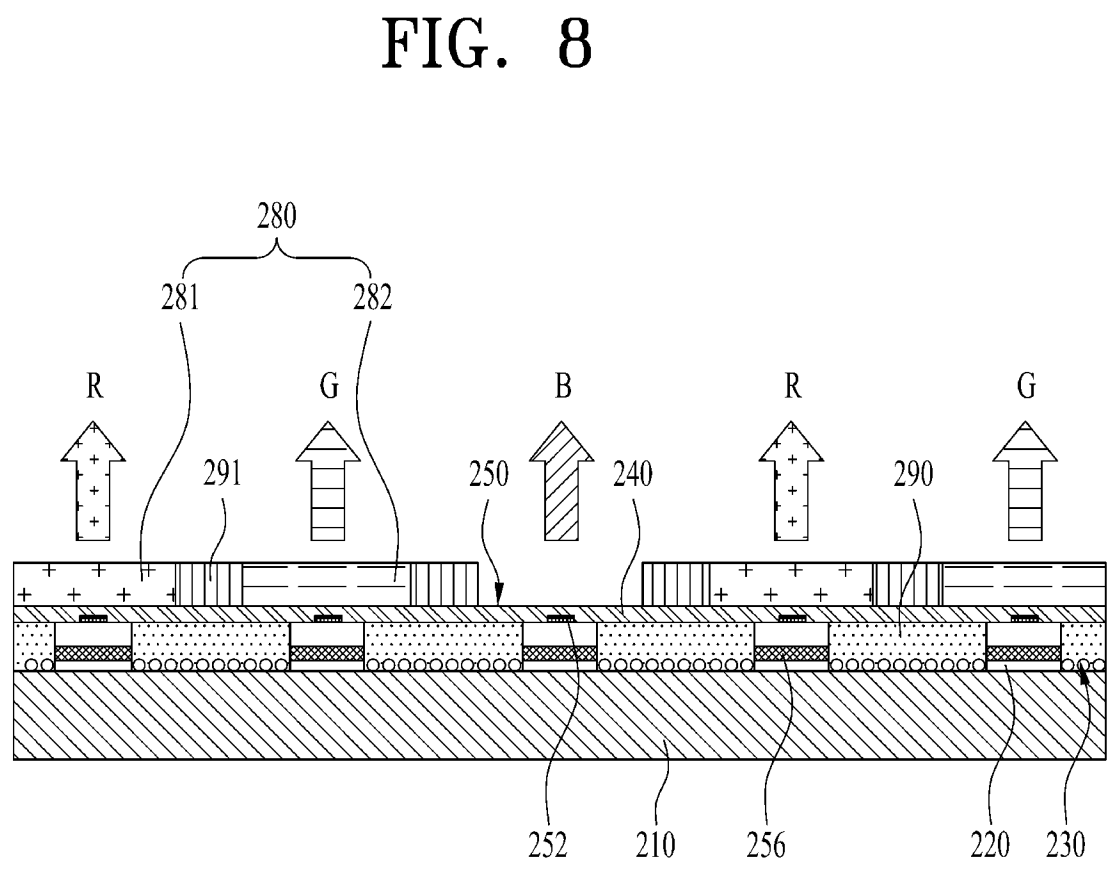
Figure 9:
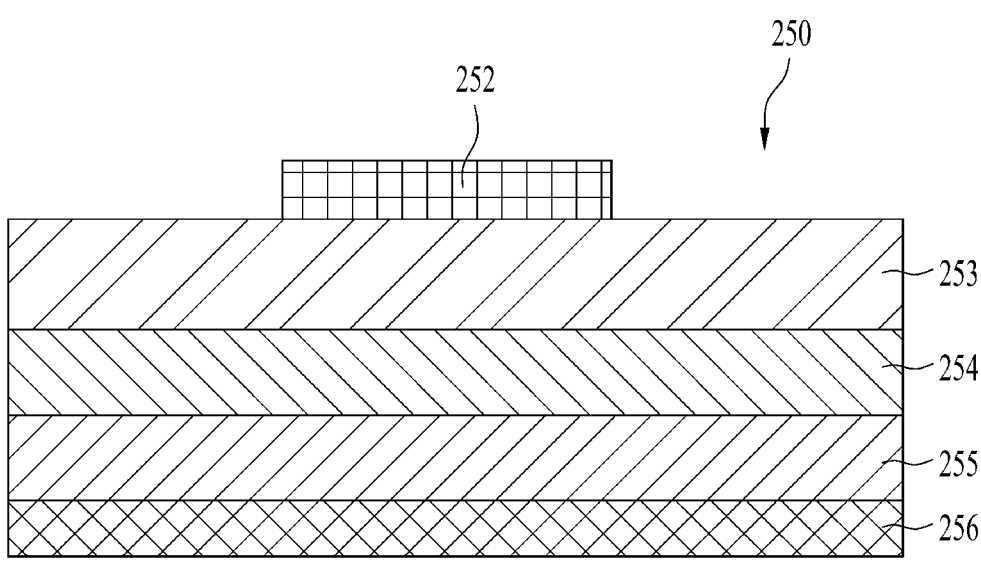
FIG. 9 is a conceptual diagram showing a vertical type semiconductor light emitting device shown in FIG. 8.

FIG. 7 is a perspective diagram of a display device using a semiconductor light emitting device according to another embodiment of the present disclosure, FIG. 8 is a cross-sectional diagram taken along a cutting line D-D shown in FIG. 8, and FIG. 9 is a conceptual diagram showing a vertical type semiconductor light emitting device shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting device 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting device 250 is connected by applying heat and pressure thereto, the semiconductor light emitting device 250 is electrically connected to the first electrode 220. In doing so, the semiconductor light emitting device 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting device 250 and the first electrode 220 as well as mechanical connection.

Thus, the semiconductor light emitting device 250 is located on the conductive adhesive layer 230, via which an individual pixel is configured in the display device. As the semiconductor light emitting device 250 has excellent luminance, an individual unit pixel may be configured in small size as well. Regarding a size of the individual semiconductor light emitting device 250, a length of one side may be equal to or smaller than 80 μm for example and the individual semiconductor light emitting device 250 may include a rectangular or square device. For example, the rectangular device may have a size equal to or smaller than 20 μm×80 μm.

The semiconductor light emitting device 250 may have a vertical structure.

Among the vertical type semiconductor light emitting devices, a plurality of second electrodes 240 respectively and electrically connected to the vertical type semiconductor light emitting devices 250 are located in a manner of being disposed in a direction crossing with a length direction of the first electrode 220.

Referring to FIG. 9, the vertical type semiconductor light emitting device 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting device 250 may dispose the electrodes at top and bottom, it is considerably advantageous in reducing a chip size.

Referring to FIG. 8 again, a phosphor layer 280 may formed on one side of the semiconductor light emitting device 250. For example, the semiconductor light emitting device 250 may include a blue semiconductor light emitting device 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting device. At a location of configuring a green unit pixel, the green phosphor 282 capable of converting blue light into green (G) light may be stacked on the blue semiconductor light emitting device. Moreover, the blue semiconductor light emitting device may be singly usable for a portion that configures a blue unit pixel. In this case, the unit pixels of red (R), green (G) and blue (B) may configure a single pixel.

Yet, the present disclosure is non-limited by the above description. In a display device to which a light emitting device of a flip chip type is applied, as described above, a different structure for implementing blue, red and green may be applicable.

Regarding the present embodiment again, the second electrode 240 is located between the semiconductor light emitting devices 250 and connected to the semiconductor light emitting devices electrically. For example, the semiconductor light emitting devices 250 are disposed in a plurality of columns, and the second electrode 240 may be located between the columns of the semiconductor light emitting devices 250.

Since a distance between the semiconductor light emitting devices 250 configuring the individual pixel is sufficiently long, the second electrode 240 may be located between the semiconductor light emitting devices 250.

The second electrode 240 may be formed as an electrode of a bar type that is long in one direction and disposed in a direction vertical to the first electrode.

In addition, the second electrode 240 and the semiconductor light emitting device 250 may be electrically connected to each other by a connecting electrode protruding from the second electrode 240. Particularly, the connecting electrode may include a n-type electrode of the semiconductor light emitting device 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting device 250 may be electrically connected to each other.

According to the drawings, the second electrode 240 may be located on the conductive adhesive layer 230. In some cases, a transparent insulating layer (not shown) containing silicon oxide (SiOx) and the like may be formed on the substrate 210 having the semiconductor light emitting device 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting device 250, there is a problem that ITO substance has poor adhesiveness to an n-type semiconductor layer. Therefore, according to the present disclosure, as the second electrode 240 is placed between the semiconductor light emitting devices 250, it is advantageous in that a transparent electrode of ITO is not used. Thus, light extraction efficiency may be improved using a conductive substance having good adhesiveness to an n-type semiconductor layer as a horizontal electrode without restriction on transparent substance selection.

According to the drawings, a partition 290 may be located between the semiconductor light emitting devices 250. Namely, in order to isolate the semiconductor light emitting device 250 configuring the individual pixel, the partition 290 may be disposed between the vertical type semiconductor light emitting devices 250. In this case, the partition 290 may play a role in separating the individual unit pixels from each other and be formed with the conductive adhesive layer 230 as an integral part. For example, by inserting the semiconductor light emitting device 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting devices 250, the partition 290 may be located between the vertical type semiconductor light emitting device 250 and the second electrode 240 each. Therefore, an individual unit pixel may be configured using the semiconductor light emitting device 250. Since a distance between the semiconductor light emitting devices 250 is sufficiently long, the second electrode 240 may be placed between the semiconductor light emitting devices 250. And, it may bring an effect of implementing a flexible display device having HD image quality.

In addition, according to the drawings, a black matrix 291 may be disposed between the respective phosphors for the contrast ratio improvement. Namely, the black matrix 291 may improve the contrast between light and shade.

As described above, the semiconductor light emitting device 250 is positioned on the conductive adhesive layer 230 and configures a separate pixel in a display device therethrough. The semiconductor light emitting device 250 has excellent luminance, and thus may configure a separate unit pixel with a small size. Accordingly, a full color display in which unit pixels of red (R), green (G), and blue (B) form one pixel may be implemented by the semiconductor light emitting device.

As described above, a bonding process for electrically connecting the semiconductor light emitting device to the wiring electrode is required in addition to the process of transferring the semiconductor light emitting device to the wiring electrode. In the bonding process, a bonding medium such as an anisotropic conductive film or an anisotropic conductive paste is required, and in this case, a process for forming the anisotropic conductive film or anisotropic conductive paste is added. Alternatively, although not described above, in the case of a method using a bump-shaped metal, a patterning process and a deposition process through photolithography are additionally required.

Hereinafter, a structure of a semiconductor light emitting device for improving product quality while being advantageous in terms of the number of steps, process difficulty, process cost, and productivity since a separate bonding process for electrically connecting the semiconductor light emitting device to the wiring electrode is not required will be described in detail.

Figure 10:
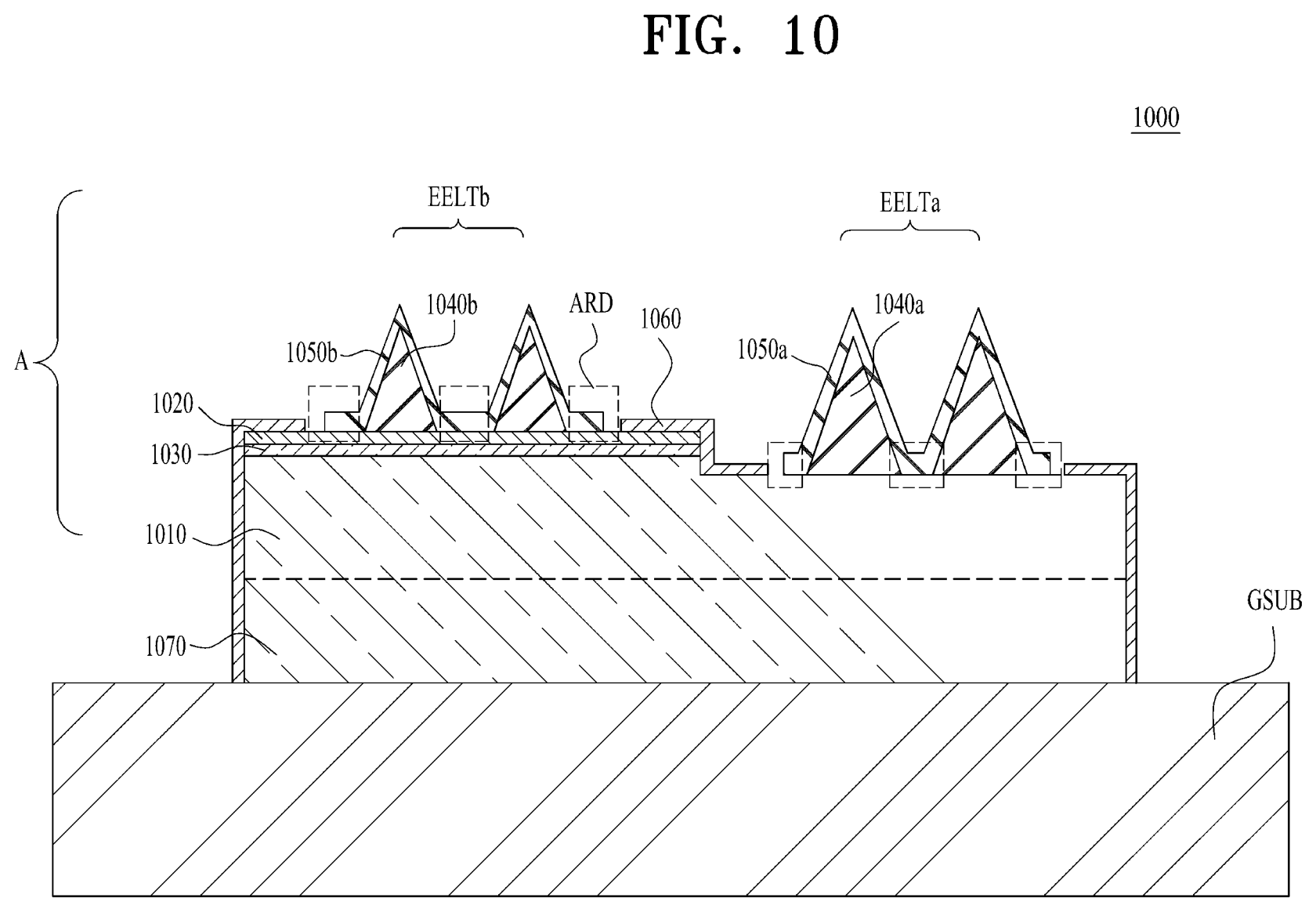

FIG. 10 is a diagram showing a semiconductor light emitting device according to an embodiment of the present disclosure.

Referring to FIG. 10, a semiconductor light emitting device 1000 according to an embodiment of the present disclosure includes a first conductive semiconductor layer 1010, a second conductive semiconductor layer 1020, an active layer 1030, semiconductor structures 1040a and 1040b, and metal layers 1050a and 1050b.

The first conductive semiconductor layer 1010 and the second conductive semiconductor layer 1020 may be an n-type semiconductor layer and a p-type semiconductor layer, respectively. That is, the first conductive semiconductor layer 1010 and the second conductive semiconductor layer 1020 may be formed by doping a semiconductor crystal grown on a growth substrate GSUB with n-type and p-type impurities, respectively. The growth substrate GSUB may be a sapphire substrate, and the first conductive semiconductor layer 1010 and the second conductive semiconductor layer 1020 may be an n-type GaN layer and a p-type GaN layer, respectively. In this case, a buffer layer 1070 may be formed between the growth substrate GSUB and the first conductive semiconductor layer 1010. The buffer layer 1070 is formed of GaN that is not doped with impurities, and may perform a function of protecting the active layer 1030 when the growth substrate GSUB is separated in a transfer process described later.

FIG. 10 illustrates an example in which the first conductive semiconductor layer 1010 and the second conductive semiconductor layer 1020 are formed like the flip chip type semiconductor light emitting device of FIG. 4. In addition, the active layer 1030, which is positioned between the first conductive semiconductor layer 1010 and the second conductive semiconductor layer 1020 and emits light, may be formed on a part of one surface of the first conductive semiconductor layer 1010. For example, the active layer 1030 may be formed with an area of about 50% of the area of one surface of the first conductive semiconductor layer 1010. The second conductive semiconductor layer 1020 may have the same area as or a similar area to that of the active layer 1030.

However, this is only for convenience of explanation, but is not limited thereto. For example, the area of the active layer 1030 may be clearly smaller or larger than that of the second conductive semiconductor layer 1020. Alternatively, the semiconductor light emitting device according to an embodiment of the present disclosure may be a vertical light emitting device as shown in FIG. 9, and the first conductive semiconductor layer 1010 and the second conductive semiconductor layer 1020 may be formed like the n-type semiconductor layer 253 and the p-type semiconductor layer 255 of FIG. 9, respectively.

The semiconductor structures 1040a and 1040b may protrude from one surface of at least one semiconductor layer of the first conductive semiconductor layer 1010 and the second conductive semiconductor layer 1020. FIG. 10 shows an example in which two of the semiconductor structures 1040a and 1040b are formed for both the first conductive semiconductor layer 1010 and the second conductive semiconductor layer 1020. However, it is not limited thereto. For example, when the semiconductor light emitting device 1000 of FIG. 10 is a vertical semiconductor light emitting device, the semiconductor structures 1040a and 1040b may be formed on only one semiconductor layer of the first conductive semiconductor layer 1010 and the second conductive semiconductor layer 1020.

In particular, when the semiconductor light emitting device 1000 of FIG. 10 is formed with the same structure as the semiconductor light emitting device of FIG. 9, the semiconductor structures 1040a and 1040b may be formed only on the second conductive semiconductor layer 1020. Alternatively, one or three or more semiconductor structures of the semiconductor structures 1040a and 1040b may be formed on at least one of the first conductive semiconductor layer 1010 and the second conductive semiconductor layer 1020, or the same number or different numbers of semiconductor structures may be formed on both the first conductive semiconductor layer 1010 and the second conductive semiconductor layer 1020. The number of the semiconductor structures 1040a and 1040b, etc. may be set differently according to a factor such as requirement for physical or electrical bonding force between device electrodes EELTa and EELTb of the semiconductor light emitting device 1000 and wiring electrodes WELTa and WELTb (in FIG. 18) described later and a degree of realization of a process therefor. Alternatively, the semiconductor structures 1040a and 1040b may be provided in numbers to distribute contact resistance between the device electrodes EELTa and EELTb and the wiring electrodes WELTa and WELTb (in FIG. 18) described below.

The semiconductor structures 1040a and 1040b may be formed by selectively growing semiconductor crystals after forming the first conductive semiconductor layer 1010 and the second conductive semiconductor layer 1020 in the growth substrate GSUB.

In one embodiment, the semiconductor light emitting device 1000 according to an embodiment of the present disclosure may further include a dielectric layer 1060 to form the semiconductor structures 1040a and 1040b. The dielectric layer 1060 may be formed on one surface of the first conductive semiconductor layer 1010 or one surface of the second conductive semiconductor layer 1020 except for the semiconductor structures 1040a and 1040b and a peripheral area ARD thereof.

Figure 11:
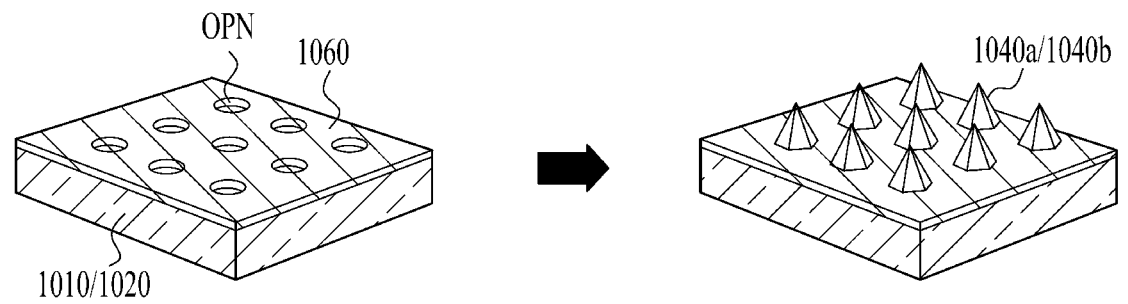
FIG. 11 is a diagram for explaining a growth method of a semiconductor structure according to an embodiment of the present disclosure.

FIG. 11 is a diagram for explaining a growth method of a semiconductor structure according to an embodiment of the present disclosure.

Referring to FIGS. 10 and 11, the dielectric layer 1060 including at least one opening OPN on one surface of the first conductive semiconductor layer 1010 or the second conductive semiconductor layer 1020 is patterned. For example, the opening OPN may be patterned by forming a dielectric layer such as oxide or nitride on one surface of the first conductive semiconductor layer 1010 or the second conductive semiconductor layer 1020 and then removing a portion of the dielectric layer.

The semiconductor structures 1040a and 1040b may be grown from a region exposed on the first conductive semiconductor layer 1010 or the second conductive semiconductor layer 1020 by the opening OPN. For example, the semiconductor structures 1040a and 1040b may be grown from the region exposed by the opening OPN by loading the growth substrate GSUB, on which the patterned dielectric layer 1060 including at least one opening OPN is formed, in a chamber and executing metalorganic chemical vapor deposition. Accordingly, the semiconductor structures 1040a and 1040b may be connected to and grown with a semiconductor crystal on one side of a semiconductor layer positioned among the first conductive semiconductor layer 1010 and the second conductive semiconductor layer 1020.

The semiconductor structures 1040a and 1040b may be formed into a desired shape according to a selective growth method by adjusting a growth condition in a chamber. For example, the growth pressure, growth temperature, and source ratio of the group III-IV compound may be set differently according to needs. The semiconductor structures 1040a and 1040b may be formed by selective growth from the opening OPN along a first crystal surface. For example, when the first conductive semiconductor layer 1010 or the second conductive semiconductor layer 1020 is formed of GaN, the first conductive semiconductor layer 1010 or the second conductive semiconductor layer 1020 may be grown along a crystal surface 10-10, 11-20, or a 10-11 to form the semiconductor structures 1040a and 1040b. Depending on which crystal surface the first crystal surface is, the semiconductor structures 1040a and 1040b may have different shapes. For example, the semiconductor structures 1040a and 1040b in a shape of a pyramid forming an angle of about 62 degrees with the first conductive semiconductor layer 1010 or the second conductive semiconductor layer 1020 as shown in FIG. 11 by growing along the crystal surface 10-11 may be formed.

At the beginning of the growth phase of the semiconductor structures 1040a and 1040b, the thickness of the semiconductor structures 1040a and 1040b is the same as the shape of the opening OPN due to the thickness of the opening OPN, and then the semiconductor structures 1040a and 1040b grow higher than the thickness of the opening OPN, and in this case, the semiconductor structures 1040a and 1040b may be temporarily grown to be greater than a diameter of the opening OPN and may then be grown into a shape in which a cross-sectional area gradually decreases. The thickness of the opening OPN, that is, the thickness of the dielectric layer 1060 may be set differently according to a growth rate and condition of the crystal structures of the semiconductor structures 1040a and 1040b that are selectively grown. For example, the thickness of the opening OPN may be formed to a thickness of 1 nm to 1 μm.

FIG. 11 illustrates an example in which the semiconductor structures 1040a and 1040b are formed in a pyramidal shape, but the present disclosure is not limited thereto.

Figure 12:
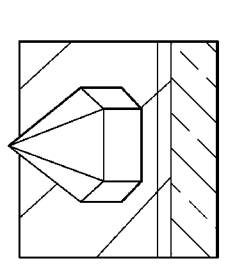
FIG. 12 is a diagram showing an example of a shape of a semiconductor structure according to an embodiment of the present disclosure.
Figure 12:
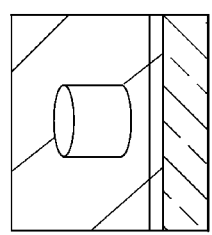
Figure 12:
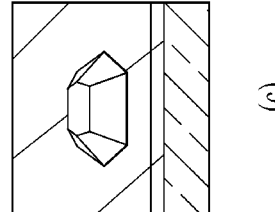
Figure 12:
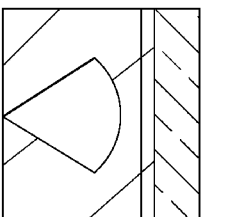
Figure 12:
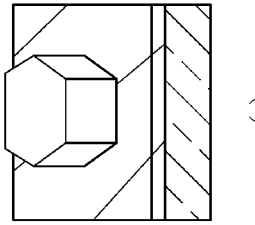

FIG. 12 is a diagram showing an example of a shape of a semiconductor structure according to an embodiment of the present disclosure.

Referring to FIG. 12, the semiconductor structures 1040a and 1040b have not only the pyramid shape of FIG. 11, but also a prism shape (FIG. 12(*a*)), a cone shape (FIG. 12(*b*)), a truncated pyramid shape (FIG. 12(*c*)), a cylinder shape (FIG. 12(*d*)), and the like. In the case of a pyramid, a prism, or a truncated pyramid, a base may be formed in a shape such as a triangle, a quadrangle, a pentagon, or a hexagon. As described above, this may be adjusted according to a patterned shape of the dielectric layer 1060 or a growth environment of a growing crystal surface. Also, as shown in FIG. 12(*e*), the semiconductor structures 1040a and 1040b may be formed in a shape in which a cross-sectional area gradually decreases after growing with the same cross-sectional area up to a partial height of a lower end where growth begins. The shapes of the semiconductor structures 1040a and 1040b may suppress total internal reflection of the semiconductor light emitting device 1000 to increase light extraction efficiency of the semiconductor light emitting device 1000.

Figures 13, 14:
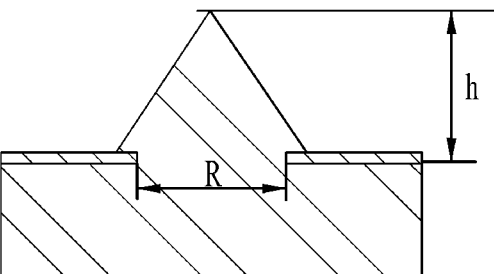
FIGS. 13 and 14 are diagrams showing examples of the diameter and height of a semiconductor structure according to an embodiment of the present disclosure, respectively.

FIGS. 13 and 14 are diagrams showing examples of the diameter and height of a semiconductor structure according to an embodiment of the present disclosure, respectively.

Referring to FIGS. 11 and 13, the semiconductor structures 1040a and 1040b may be formed in a desired shape according to the selective growth method as described above, and thus may be formed in a required size by adjusting a growth condition. For example, a height h of the semiconductor structures 1040a and 1040b depends on demands for physical or electrical bonding force of the structure of the wiring electrodes WELTa and WELTb (in FIG. 18) described later or the device electrodes EELTa and EELTb of the semiconductor light emitting device 1000 and the wiring electrodes WELTa and WELTb (in FIG. 18) described later and a degree of realization of a process therefor or may be set depending on a process time required for growth of the semiconductor structures 1040a and 1040b. For example, the height h of the semiconductor structures 1040a and 1040b may be required to be formed with 25% to 45% of a thickness obtained by excluding the semiconductor structures 1040a and 1040b from the semiconductor light emitting device 1000 so as to be stably transferred and electrically connected to the wiring electrodes WELTa and WELTb (in FIG. 18) described later.

Referring to FIGS. 11 and 14, the semiconductor structures 1040a and 1040b may be grown with the height h that is different depending on a diameter R of the semiconductor structures 1040a and 1040b. The diameter R of the semiconductor structures 1040a and 1040b may be set by adjusting the diameter of the opening OPN of the dielectric layer 1060 described above. For example, if the semiconductor light emitting device 1000 is to be formed with a height of about 6 μm, the semiconductor structures 1040a and 1040b may be required to be formed with a height of about 2.6 μm, and in this case, the dielectric layer 1060 may be patterned in such a way that the diameter R of the opening OPN is about 3 μm.

Referring back to FIG. 10, the first conductive semiconductor layer 1010 and the second conductive semiconductor layer 1020 may be formed with a step difference in a first direction (e.g., a horizontal direction). For example, the first conductive semiconductor layer 1010 and the second conductive semiconductor layer 1020 may be formed within 0.5 μm to 2 μm. The second conductive semiconductor layer 1020 may be formed higher than the first conductive semiconductor layer 1010. In this case, the heights of the semiconductor structures 1040a and 1040b on the first conductive semiconductor layer 1010 may be set higher than the heights of the semiconductor structures 1040a and 1040b on the first conductive semiconductor layer 1010 by the step difference.

After growth of the semiconductor structures 1040a and 1040b is completed, the dielectric layer 1060 of the peripheral area ARD of the semiconductor structures 1040a and 1040b is opened, and the first conductive semiconductor layer 1010 and the second conductive semiconductor layer 1020 under the peripheral area ARD may be exposed.

The metal layers 1050a and 1050b may be formed on an outer surfaces of the semiconductor structures 1040a and 1040b and the peripheral area ARD of the semiconductor structures 1040a and 1040b from which the dielectric layer 1060 is removed. FIG. 10 shows that the metal layers 1050a and 1050b are not formed for a portion of the peripheral area ARD of the semiconductor structures 1040a and 1040b, but this may vary depending on process margins, etc., and the technical spirit of the present disclosure is not limited thereby.

The semiconductor structures 1040*a* and 1040*b* are formed by stacking the metal layers 1050*a* and 1050*b* on their outer surfaces. Accordingly, the shapes of the metal layers 1050*a* and 1050*b* may be set differently according to the shapes of the semiconductor structures 1040*a* and 1040*b*. Since FIG. 10 shows an example in which the semiconductor structures 1040*a* and 1040*b* are formed in a pyramid or cone shape, the metal layers 1050*a* and 1050*b* may be formed in the same shape as a side surface of the pyramid or the side surface of the cone. A more detailed description of the metal layers 1050*a* and 1050*b* will be described later. The semiconductor structures 1040*a* and 1040*b* and the metal layers 1050*a* and 1050*b* may constitute the device electrodes EELTa and EELTb together.

Figure 15:
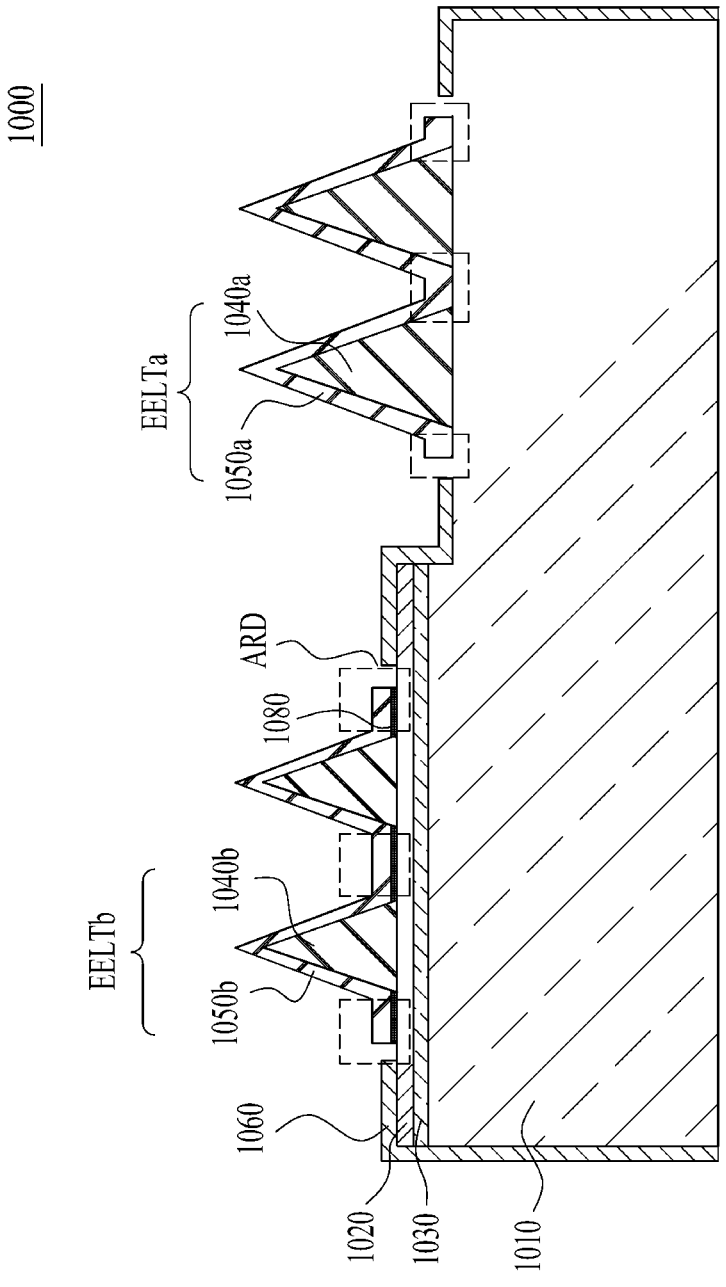
FIG. 15 is an enlarged view of an area A of FIG. 10.

FIG. 15 is an enlarged view of an area A of FIG. 10.

Referring to FIG. 15, an ohmic contact layer 1080 is further formed between the second conductive semiconductor layer 1020 and the metal layer 1050*b*. For example, when the second conductive semiconductor layer 1020 is a p-type semiconductor layer, the ohmic contact layer 1080 may be formed by stacking ITO or an ohmic metal (e.g., Pt, Pd, or NiAu alloy) on the second conductive semiconductor layer 1020. When the first conductive semiconductor layer 1010 is an n-type semiconductor layer and the metal layer 1050*a* includes Ti or Cr, ohmic contact may be formed between the first conductive semiconductor layer 1010 and the metal layer 1050*a* without an additional structure.

The semiconductor structures 1040*a* and 1040*b* according to an embodiment of the present disclosure may not have conductivity because the semiconductor structures 1040*a* and 1040*b* are not doped with impurities. In this case, since ohmic contact is formed in the peripheral area ARD of the semiconductor structures 1040*a* and 1040*b*, the first conductive semiconductor layer 1010 and the second conductive semiconductor layer 1020 may be conducted with a voltage applied to the metal layers 1050*a* and 1050*b*.

Figure 16:
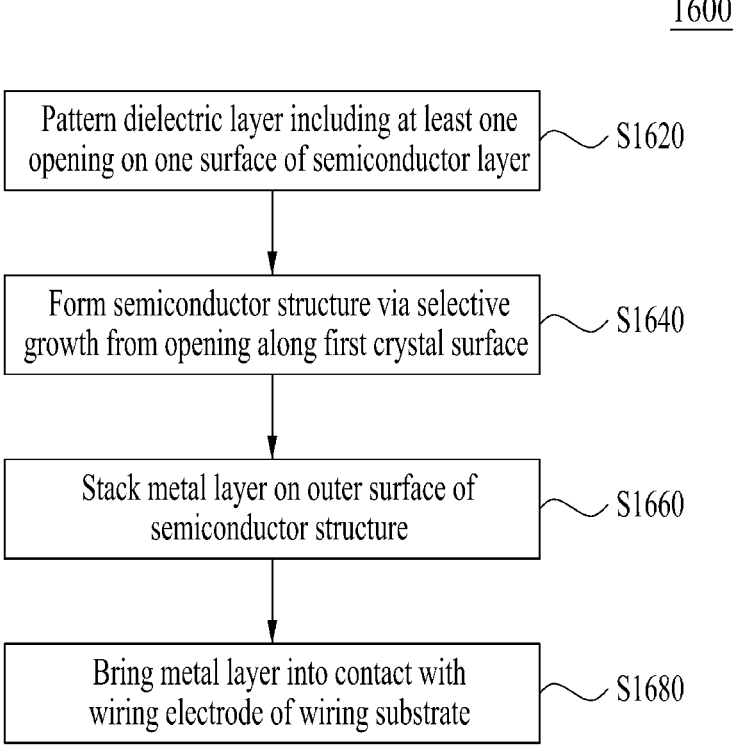
FIGS. 16 and 17 are diagrams showing a method of manufacturing a display device according to an embodiment of the present disclosure.
Figure 17:
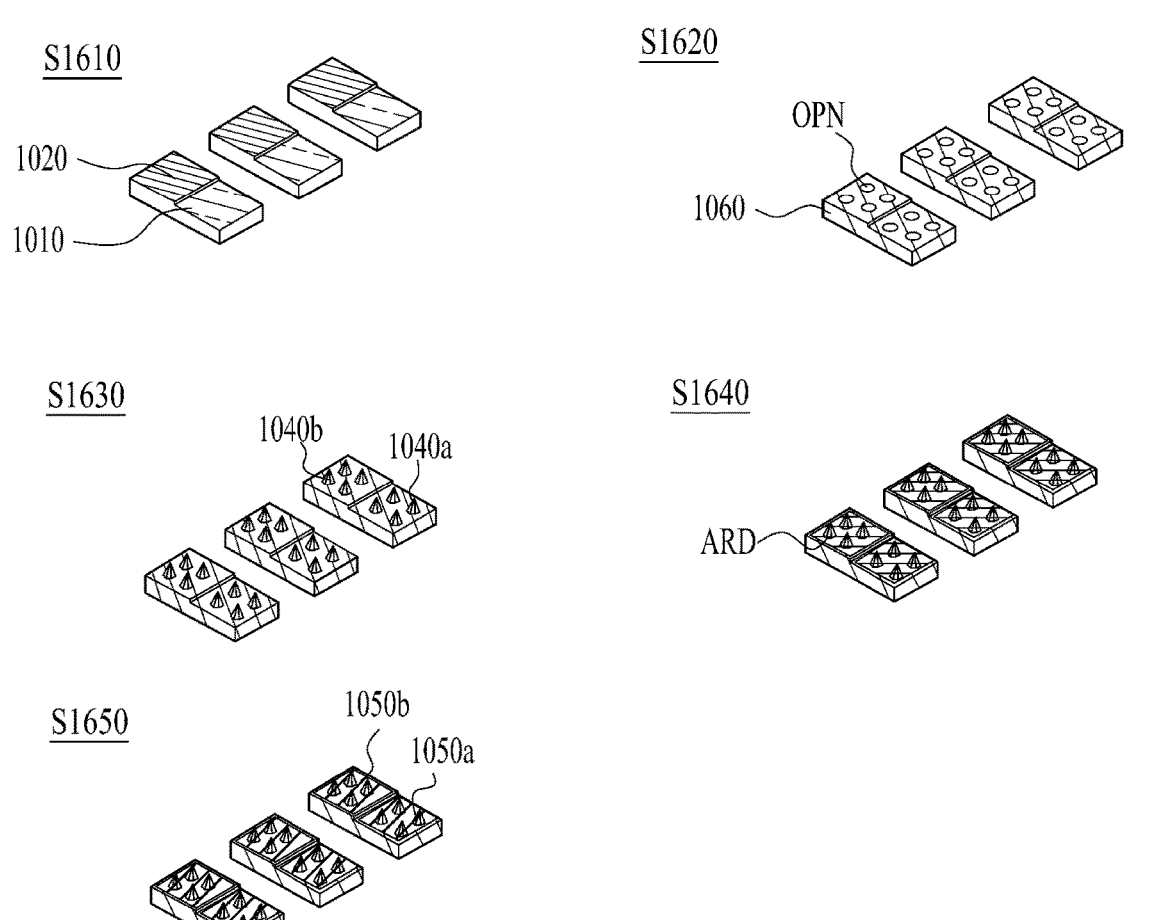
Figure 18:
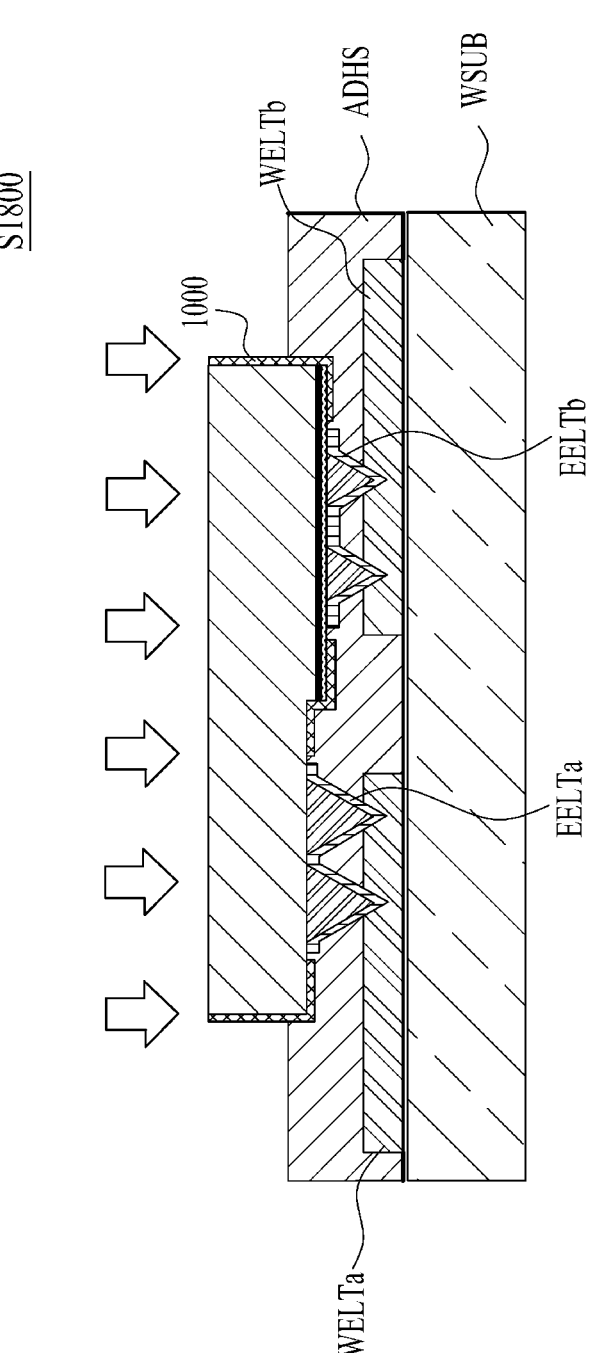
FIG. 18 is a diagram showing a display device according to an embodiment of the present disclosure.

FIGS. 16 and 17 are diagrams showing a method of manufacturing a display device according to an embodiment of the present disclosure. FIG. 18 is a diagram showing a display device according to an embodiment of the present disclosure.

In describing a display device 1800 and a manufacturing method 1600 according to an embodiment of the present disclosure with reference to FIGS. 16 to 18, redundant parts of the above description will be described only when necessary. The manufacturing method 1600 of the display device 1800 according to an embodiment of the present disclosure may include patterning the dielectric layer 1060 including at least one opening OPN on one surface of the semiconductor layers 1010 and 1020 doped with an arbitrary conductivity type (S1620), forming the semiconductor structures 1040*a* and 1040*b* through selective growth from the opening OPN along the first crystal surface (S1640), stacking the metal layers 1050*a* and 1050*b* on the outer surfaces of the semiconductor structures 1040*a* and 1040*b* (S1660), and bringing the metal layers 1050*a* and 1050*b* into contact with the wiring electrodes WELTa and WELTb of a wiring substrate WSUB (S1680).

Prior to the patterning of the dielectric layer 1060 (S1620), the first conductive semiconductor layer 1010 and the second conductive semiconductor layer 1020 may be formed (S1610). For example, an n-type GaN layer and a p-type GaN layer may be formed on a sapphire substrate. The first conductive semiconductor layer 1010 and the second conductive semiconductor layer 1020 may be formed with a step difference in the first direction.

In the patterning of the dielectric layer 1060 (S1620), patterning may be performed to form the opening OPN for both the first conductive semiconductor layer 1010 and the second conductive semiconductor layer 1020. However, as described above, the opening OPN may be formed only for one semiconductor layer.

The semiconductor structures 1040*a* and 1040*b* may be grown from the area exposed by the opening OPN by loading a substrate on which the dielectric layer 1060 is patterned (e.g., the growth substrate GSUB in FIG. 10) into a chamber and executing Metalorganic Chemical Vapor Deposition (S1640). The semiconductor structures 1040*a* and 1040*b* may be grown into various shapes shown in FIGS. 11 and 12.

The dielectric layer 1060 may be removed (opened) for the peripheral area ARD of the semiconductor structures 1040*a* and 1040*b* after the semiconductor structures 1040*a* and 1040*b* are formed on one surface of the first conductive semiconductor layer 1010 and the second conductive semiconductor layer 1020 (S1650). After opening the dielectric layer 1060 of the peripheral area ARD of the semiconductor structures 1040*a* and 1040*b* (S1650), the metal layers 1050*a* and 1050*b* may be stacked on the outer surface of the semiconductor structures 1040*a* and 1040*b* and the peripheral area ARD of the semiconductor structures 1040*a* and 1040*b* and 1050*b* (S1660). However, the present disclosure is not limited thereto, and the dielectric layer 1060 may be completely removed through a removal process after the semiconductor structures 1040*a* and 1040*b* are formed.

The semiconductor light emitting device 1000 formed as such is transferred to the wiring substrate WSUB (S1680). However, the semiconductor light emitting device 1000 may not be directly transferred to the wiring substrate WSUB, but may be transferred to a temporary substrate (not shown) and then transferred to the wiring substrate WSUB again. Through the transfer process, the growth substrate GSUB as shown in FIG. 10 may be removed.

The wiring electrodes WELTa and WELTb according to an embodiment of the present disclosure may be surrounded by an adhesive layer ADHS. When the semiconductor light emitting device 1000 is transferred to the wiring substrate WSUB, the protruding device electrodes EELTa and EELTb may be disposed through the adhesive layer ADHS molding the wiring electrodes WELTa and WELTb and may contact the electrodes WELTa and WELTb (S1680). The adhesive layer ADHS includes an adhesive material and a diluent that lowers the viscosity of the adhesive material to lower ductility, and thus the device electrodes EELTa and EELTb may be easily compressed and penetrated.

As such, since the metal layers 1050*a* and 1050*b* of the device electrodes EELTa and EELTb directly contact the wiring electrodes WELTa and WELTb in the step of transferring the semiconductor light emitting device 1000 to the wiring substrate WSUB, the device electrodes EELTa and EELTb and the wiring electrodes WELTa and WELTb of the semiconductor light emitting device 1000 may be electrically coupled to each other using only the pressure (indicated by an arrow) applied during the process in which the semiconductor light emitting device 1000 is transferred onto the wiring substrate WSUB without performing a separate bonding process using a conductive medium such as ACF, ACP or metal bump in order to electrically connect the device electrodes EELTa and EELTb and the wiring electrodes WELTa and WELTb.

In this case, the wiring electrodes WELTa and WELTb may be formed of metals having a lower hardness or higher ductility than the semiconductor structure, such as an alloy of indium, tin, lead, or the like. Alternatively, when the semiconductor light emitting device 1000 is transferred to the wiring substrate WSUB, heat for melting the wiring electrodes WELTa and WELTb to a certain extent may be applied. Therefore, when the protruding device electrodes EELTa and EELTb of the semiconductor light emitting device 1000 apply pressure to the wiring electrodes WELTa and WELTb during the transfer process of the semiconductor light emitting device 1000, the wiring electrodes WELTa and WELTb may be melted to a certain extent to stably couple parts of the device electrodes EELTa and EELTb to the wiring electrodes WELTa and WELTb.

The state in which ends of the device electrodes EELTa and EELTb and parts of the wiring electrodes WELTa and WELTb in contact with the ends are united by a natural decrease in temperature after the heat treatment process or by a separate UV curing process may be maintained. In addition, an area at which the metal layers 1050a and 1050b of the device electrodes EELTa and EELTb and the wiring electrodes WELTa and WELTb are in contact with each other may be processed through various methods, and thus the device electrodes EELTa and EELTb and the wiring electrodes WELTa and WELTb may be stably coupled to each other. Alternatively, grooves (not shown) corresponding to the shapes of the semiconductor structures 1040a and 1040b may be provided in the wiring electrodes WELTa and WELTb to further strengthen the coupling between the device electrodes EELTa and EELTb and the wiring electrodes WELTa and WELTb.

When the first conductive semiconductor layer 1010 and the second conductive semiconductor layer 1020 are formed with a step difference, heights of the semiconductor structure 1040a formed on the first conductive semiconductor layer 1010 and the semiconductor structure 1040b formed on the second conductive semiconductor layer 1020 may be differently formed. In an example in which the second conductive semiconductor layer 1020 is formed higher than the first conductive semiconductor layer 1010, the semiconductor structure 1040a formed on the first conductive semiconductor layer 1010 may be higher than the first semiconductor structure 1040b formed on the second conductive semiconductor layer 1020 by a step difference between the conductive semiconductor layer 1010 and the second conductive semiconductor layer 1020. In this case, although the first conductive semiconductor layer 1010 and the second conductive semiconductor layer 1020 have a step difference, even if the same pressure is applied during the process in which the first conductive semiconductor layer 1010 is transferred to the wiring substrate WSUB, both the device electrode EELTa for the first conductive semiconductor layer 1010 and the device electrode EELTb for the second conductive semiconductor layer 1020 may simultaneously contact the corresponding wiring electrodes WELTa and WELTb. Alternatively, even if the first conductive semiconductor layer 1010 and the second conductive semiconductor layer 1020 have a step difference, the semiconductor structures 1040a and 1040b may be provided with the same size, and instead, the heights of the wiring electrodes WELTa and WELTb may be different.

As such, according to the semiconductor light emitting device 1000, the display device 1800 and the manufacturing method 1600 according to the present disclosure, a separate bonding process for electrically coupling the device electrodes EELTa and EELTb and the wiring electrodes WELTa and WELTb may be omitted through the structure of the semiconductor light emitting device 1000, the structure or material of the wiring electrodes WELTa and WELTb and/or a transfer process condition, and thus the device electrodes EELTa and EELTb of the semiconductor light emitting device 1000 and the wiring electrodes WELTa and WELTb may be more easily and stably achieved, and through process simplification, and production cost may be reduced while improving product yield.

The display device using the semiconductor light emitting device described above is not limited to the configuration and method of the embodiments described above, but the embodiments are configured by selectively combining all or part of each embodiment to make various modifications.

The invention claimed is:

1. A semiconductor light emitting device electrically connected to a display device, including a wiring substrate having one surface on which a wiring electrode is disposed and an adhesive layer disposed to surround the wiring electrode comprising:
   a first conductive semiconductor layer and a second conductive semiconductor layer;
   an active layer disposed between the first conductive semiconductor layer and the second conductive semiconductor layer;
   a semiconductor structure protruding from one surface of at least one semiconductor layer of the first conductive semiconductor layer or the second conductive semiconductor layer; and
   a metal layer stacked and disposed on an outer surface of the semiconductor structure,
   wherein the metal layer is electrically connected to the wiring electrode molded on the adhesive layer of the display device.

2. The semiconductor light emitting device of claim 1, further comprising:
   a dielectric layer disposed on one surface of the first conductive semiconductor layer or one surface of the second conductive semiconductor layer except for an area in contact with the semiconductor structure and a peripheral area of the semiconductor structure.

3. The semiconductor light emitting device of claim 1, wherein the semiconductor structure is provided in plurality for the first conductive semiconductor layer or the second conductive semiconductor layer.

4. The semiconductor light emitting device of claim 1, wherein the semiconductor structure is formed in one of shapes of a cone, a polygonal pyramid, a cylinder, a prism, a truncated cone, and a truncated pyramid.

5. The semiconductor light emitting device of claim 1, wherein the semiconductor structure is connected to a semiconductor crystal on one surface of a semiconductor layer positioned among the first conductive semiconductor layer and the second conductive semiconductor layer.

6. The semiconductor light emitting device of claim 1, wherein the semiconductor structure is formed with a height of 25% to 45% of a thickness obtained by excluding the semiconductor structure from the semiconductor light emitting device, and the semiconductor structure is formed with a diameter corresponding to the height of the semiconductor structure.

7. The semiconductor light emitting device of claim 1, wherein ohmic contact is formed between a peripheral area of the semiconductor structure and the metal layer.

8. The semiconductor light emitting device of claim 1, wherein the second conductive semiconductor layer is formed with a step difference with the first conductive semiconductor layer in a first direction; and
   wherein a height of the semiconductor structure for the second conductive semiconductor layer and a height of the semiconductor structure for the first conductive semiconductor layer are different by the step difference.

9. A display device comprising:
a wiring substrate having one surface on which a wiring electrode is disposed;
an adhesive layer disposed to surround the wiring electrode; and
a semiconductor light emitting device including a first conductive semiconductor layer, a second conductive semiconductor layer, an active layer disposed between the first conductive semiconductor layer and the second conductive semiconductor layer, and an device electrode that comes into contact with the wiring electrode by pressing and penetrating the adhesive layer,
wherein the device electrode includes:
at least one semiconductor structure protruding and formed by a first height from one surface of at least one semiconductor layer of the first conductive semiconductor layer and the second conductive semiconductor layer; and
a metal layer stacked and disposed on an outer surface of the semiconductor structure,
wherein the adhesive layer is molded to the wiring electrode on the wiring substrate, and
wherein the metal layer and the wiring electrode are electrically connected.

10. The display device of claim 9, wherein the semiconductor light emitting device further includes a dielectric layer formed on one surface of a semiconductor layer, on which the semiconductor structure is formed, among the first conductive semiconductor layer and the second conductive semiconductor layer except for an area in contact with the semiconductor structure and a peripheral area of the semiconductor structure.

11. The display device of claim 10, wherein the semiconductor light emitting device further includes ohmic contact between the peripheral area of the semiconductor structure and the metal layer.

12. The display device of claim 10, wherein the semiconductor structure is formed in a shape in which a cross-sectional area decreases from one surface of the dielectric layer to an arbitrary section of the first height.

13. The display device of claim 9, wherein:
the semiconductor structure is formed for both the first conductive semiconductor layer and the second conductive semiconductor layer;
the first conductive semiconductor layer and the second conductive semiconductor layer are formed with a step difference in a first direction; and
the first height of the semiconductor structure formed for the first conductive semiconductor layer and the first height of the semiconductor structure formed for the second conductive semiconductor layer are different.

14. The display device of claim 9, wherein the wiring electrode is formed of a metal having a lower hardness or higher ductility than the semiconductor structure.

15. The display device of claim 9, wherein a groove corresponding to a shape of the device electrode is formed on one surface of the wiring electrode, which is in contact with the device electrode.

16. The display device of claim 9, wherein the adhesive layer includes an adhesive material and a diluent lowering viscosity of the adhesive material.

17. A method of manufacturing a display device, the method comprising:
patterning a dielectric layer including at least one opening on one surface of a semiconductor layer doped with an arbitrary conductivity type;
forming a semiconductor structure through selective growth from the opening along a first crystal surface;
stacking a metal layer on an outer surface of the semiconductor structure; and
bringing the metal layer into contact with a wiring electrode of a wiring substrate,
wherein the bringing the metal layer into contact with the wiring electrode includes:
forming an adhesive layer molding the wiring electrode on the wiring substrate;
electrically connecting the metal layer and the wiring electrode without forming a conductive medium through transfer of a semiconductor light emitting device to the wiring substrate; and
deforming one end of the metal layer in contact with the wiring electrode or a region of the wiring electrode in contact with the metal layer.

18. The method of claim 17, wherein:
the patterning of the dielectric layer includes performing the patterning the dielectric layer for a first conductive semiconductor layer doped with a first conductivity type and a second conductive semiconductor layer doped with a second conductivity type and having a step difference with the first conductive semiconductor layer in a first direction; and
the forming of the semiconductor structure includes forming a semiconductor structure formed for the first conductive semiconductor layer and a semiconductor structure formed for the second conductive semiconductor layer with different sizes.

19. The method of claim 17, wherein:
the electrically connecting the metal layer and the wiring electrode is performed in a state in which heat is applied; and
the deforming one end of the metal layer in contact with the wiring electrode or the region of the wiring electrode in contact with the metal layer includes curing.

* * * * *